(12) United States Patent
Liu

(10) Patent No.: US 6,354,474 B1
(45) Date of Patent: Mar. 12, 2002

(54) APPARATUS FOR MEASURING VALVE DISPENSING TIME AND METHOD OF USING THE SAME

(75) Inventor: Hsying Chyean Liu, Tainan Hsien (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/706,264

(22) Filed: Nov. 3, 2000

(30) Foreign Application Priority Data

Aug. 15, 2000 (TW) ........................ 89116428 A

(51) Int. Cl.[7] .................................................. G04C 23/00
(52) U.S. Cl. ....................... 222/644; 368/120; 118/703; 118/712; 427/10
(58) Field of Search ................... 222/52, 644; 368/120; 118/703, 712; 427/10

(56) References Cited

U.S. PATENT DOCUMENTS

| 5,982,712 A | * 11/1999 | Smith | 368/120 |
| 5,985,357 A | * 11/1999 | Sanada | 118/712 |
| 6,099,646 A | * 8/2000 | Yang et al. | 118/703 |

* cited by examiner

Primary Examiner—Philippe Derakshani
(74) Attorney, Agent, or Firm—J.C. Patents

(57) ABSTRACT

An apparatus for measuring valve dispensing time. In the apparatus, an optical fiber sensor is located arranged in the vicinity of an outlet of a nozzle. A magnetic field is generated in coils of a first relay by an ON signal from an electromagnetic valve, such that contacts thereof are connected to each other. A magnetic field is generated in coils of a second relay by an OFF signal from the electromagnetic valve, such that contacts thereof are connected to each other. A stopwatch has a start terminal connected to the first relay and a stop terminal connected to the second relay. When the electromagnetic valve transmits a signal to the suckback valve to dispense the photoresist from the nozzle, a ON signal is transmitted to generate a magnetic field in coils of the first relay, while contacts of the first relay are connected to start the stop watch. When the optical fiber sensor detects the photoresist dispensed from the outlet of the nozzle, a OFF signal is transmitted to the second relay to generate a magnetic field, while contacts of the second relay are connected to stop the stop watch. The value read from the stopwatch is the delay time between the suckback valve and the electromagnetic valve.

12 Claims, 3 Drawing Sheets

# APPARATUS FOR MEASURING VALVE DISPENSING TIME AND METHOD OF USING THE SAME

CROSS-REFERENCE TO RELATED APPLICATION

This application claims the priority benefit of Taiwan application serial no. 89116428, filed Aug. 15, 2000.

BACKGROUND OF THE INVENTION

1. Field of the Invention

The present invention relates to an apparatus for measuring valve dispensing time and the method of using the same. More specifically, the present invention relates to an apparatus for measuring the time for photoresist dispensing from the suckback valve, especially in a photoresist coating apparatus, and a method of using the same.

2. Description of the Related Art

Photoresist plays an important role in semiconductor fabrication. For example, in the etching process, the photoresist is used as mask for etching films to keep the desired patterns from being removed by etching. In the ion implantation, the photoresist serves as a mask, allow dopants to be implanted only in the predetermined regions. The photoresist used in the lithography process is liquid. The suckback valve is controlled by the electromagnetic valve on the photoresist coating apparatus to dispense the photoresist on the surfaces of the wafers from a nozzle. The wafers are arranged on a spin coater to rotate the wafers. The photoresist can be coated uniformly on the surfaces of the wafers by centrifugal force. The photoresist is made of a mixture consisting of resins, sensitization agents and solvents with various ratios. The viscosity coefficient of the photoresist varies with the ratio of the mixture set forth above.

In photoresist coating process, poor coating and planarity sometimes occurs as shown in FIGS. 1A–1E. FIG. 1A is a schematic diagram of photoresist coverage on a wafer where the photoresist in the vicinity of the center is thicker than in other regions. FIG. 1B is a schematic diagram of photoresist coverage on a wafer where the photoresist in the lower right region is thicker than in other regions. FIG. 1C is a schematic diagram of discontinuous photoresist coverage on a wafer caused by bubbles generated in the photoresist. FIG. 1D is a schematic diagram of photoresist coverage on a wafer where the photoresist in the lower right peripheral region is thicker than in other regions. FIG. 1E is a schematic diagram of photoresist coverage on a wafer where peripheral areas of the wafer lack photoresist coating. When the photoresist coating has the above defects, the yield or the reliability of the wafers are reduced, and the wafers may even fail.

The above poor coating and planarity are caused by not only the changed viscosity of the photoresist, but also abnormal condition of the photoresist coating apparatus, resulting in non-uniform thickness of the photoresist coating on the surfaces of the wafers. Due to the delay time between the suckback valve and the electromagnetic valve, the suckback vale is unable to rapidly respond to the controlling signal of the electromagnetic valve, resulting in the above abnormal condition of the photoresist coating apparatus.

Usually, if the value obtained by subtracting the maximum thickness from the thickness of the photoresist (called planarity) exceeds 100 angstroms, or in wafer fabrication, the above defects in the photoresist coating are found, the operation must stop to test and adjust the suckback valve.

The conventional test and adjustment with regard to the function of the suckback valve are carried out visually and manually. When the electromagnetic valve outputs an ON signal to the suckback valve to open the lines so as to dispense the photoresist, the timer is started immediately. Then, the outlet of the nozzle is observed visually. When the photoresist begins to be dispensed, the timer is stopped immediately. The suckback valve can be determined as normal or abnormal by the time displayed on the timer. Alternatively, the displayed time can be adjusted to obtain the optimum photoresist coating. Visual and manual operation often results in human errors, and the demand for high operation accuracy cannot be satisfied.

SUMMARY OF INVENTION

To solve the above prior problems, an apparatus for measuring valve dispensing time which can control the delay time between the suckback valve and the electromagnetic valve to enhance the planarity of the photoresist coating and prevent the photoresist coating from generating defects, and the method of using the same.

According to one aspect of the present invention, an apparatus for measuring valve dispensing time is provided, comprising an optical fiber sensor arranged in the vicinity of the outlet of a nozzle; a first relay in which a magnetic field is generated in coils of the first relay by an ON signal from the electromagnetic valve, such that contacts thereof are connected to each other; a second relay in which a magnetic field is generated in coils of the second relay by an OFF signal from the electromagnetic valve, such that contacts thereof are connected to each other; and a stop watch including a start terminal connected to the first relay and a stop terminal connected to the second relay.

According to another aspect of the present invention, a method of measuring valve dispensing time is provided, comprising providing an optical fiber sensor in the vicinity of the outlet of a nozzle; providing a first relay; providing a second relay; and providing a stop watch. When the electromagnetic valve transmits a signal to the suckback valve to dispense the photoresist from the nozzle, an ON signal is transmitted to generate a magnetic field in coils of the first relay; at the same time contacts of the first relay are connected to start the stop watch. When the optical fiber sensor detects the photoresist dispensed from the outlet of the nozzle, an OFF signal is transmitted to the second relay to generate a magnetic field. At the same time, contacts of the second relay are connected to stop the stopwatch, with the value read from the stopwatch being the delay time between the suckback valve and the electromagnetic valve.

BRIEF DESCRIPTION OF THE DRAWINGS

It is to be understood that both the foregoing general description and the following detailed description are exemplary, and are intended to provide further explanation of the invention as claimed.

The accompanying drawings are included to provide a further understanding of the invention, and are incorporated in and constitute a part of this specification. The drawings illustrate embodiments of the invention and, together with the description, serve to explain the principle of the invention. In the drawings.

DESCRIPTION OF THE PREFERRED EMBODIMENT

Figure 1A:
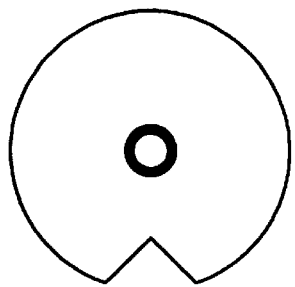
FIG. 1A is a schematic diagram of photoresist coverage on a wafer where the photoresist in the vicinity of the center is thicker than in other regions.
Figure 1B:
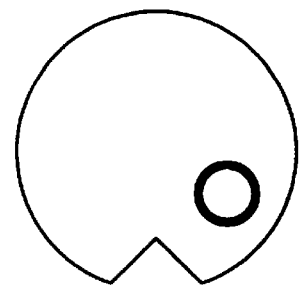
FIG. 1B is a schematic diagram of photoresist coverage on a wafer where the photoresist in the lower right region is thicker than in other regions.
Figure 1C:
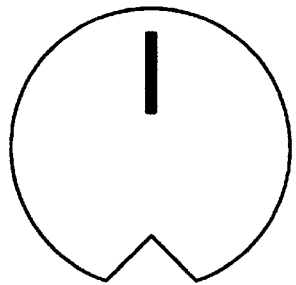
FIG. 1C is a schematic diagram of discontinuous photoresist coverage on a wafer caused by bubbles.
Figure 1D:
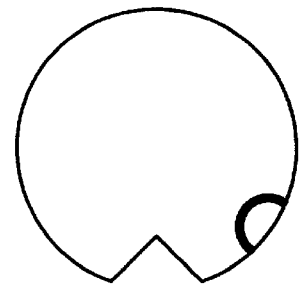
FIG. 1D is a schematic diagram of photoresist coverage on a wafer where the photoresist in the lower right peripheral region is thicker than in other regions.
Figure 1E:
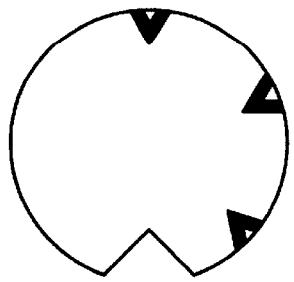
FIG. 1E is a schematic diagram of photoresist coverage on a wafer where peripheral areas of the wafer lack photoresist coating.
Figure 2:
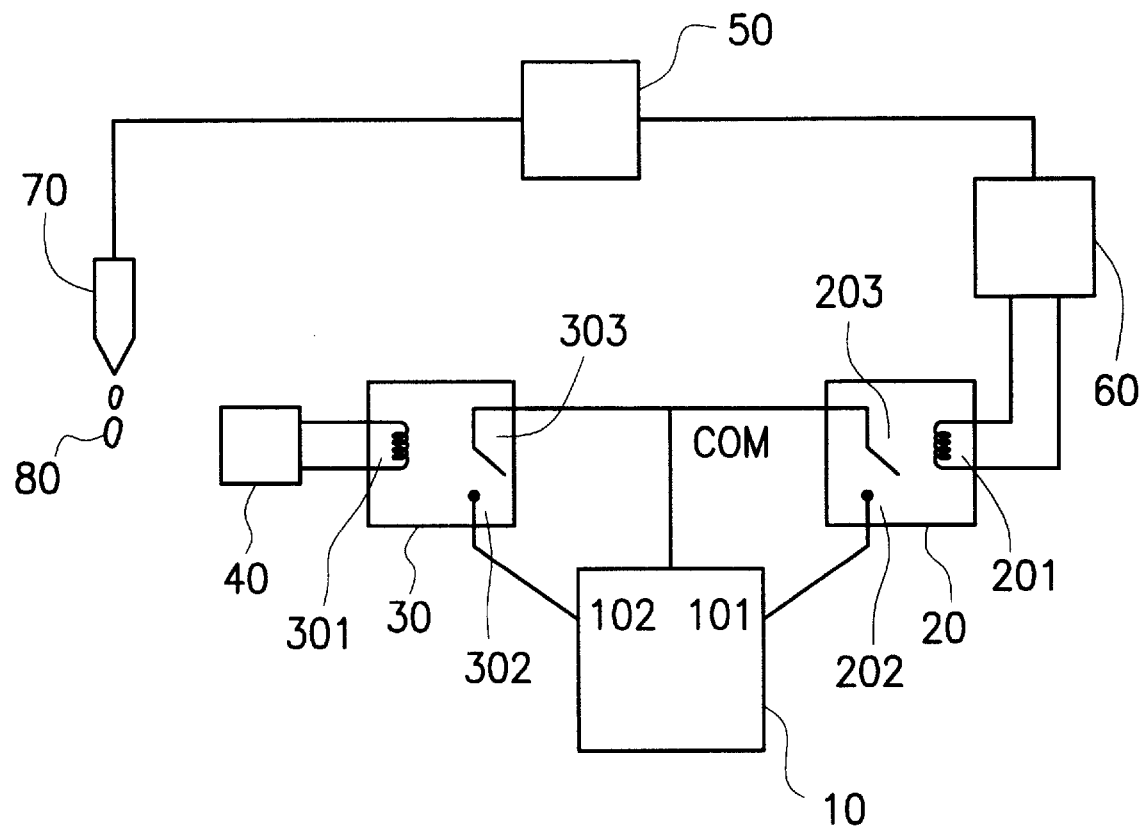
FIG. 2 is a schematic diagram of the apparatus for measuring valve dispensing time according to one preferred embodiment of the present invention, and FIG. 3 reveals experimental results regarding the relationship between the delay time between the suckback valve and the electromagnetic valve and the difference obtained by subtracting the maximum photoresist thickness from minimum photoresist thickness in accord with the present invention.

FIG. 2 is a schematic diagram of the apparatus for measuring valve dispensing time according to one preferred embodiment of the present invention. The apparatus for measuring valve dispensing time consists of a stopwatch 10, a first relay 20, a second relay 30, and an optical fiber sensor 40. The stopwatch 10 is a digital timer with accuracy up to $1/100$ second. The stopwatch includes a start terminal 101, a stop terminal 102, a first relay 20 and a second relay 30. The stopwatch can be a super mini stray capacity type. The optical fiber sensor 40 can be a plastic optical fiber sensor such as the Q19 series product. The optical fiber sensor 40 can be also used to monitor the period from starting to dispense the photoresist from the nozzles to stopping the same. Further, the optical fiber sensor 40 can be used to detect discontinuous photoresist dispensing and provide a delay time between the electric signal of the suckback valve 50 and the actual photoresist dispensing.

The start terminal 101 of the stopwatch 10 is connected to the first relay 20 and the first relay 20 is connected to the electromagnetic valve 60. The stop terminal 102 is connected to the second relay 30, and the second relay 30 is connected to the optical fiber sensor 40. One end of the suckback valve 50 is connected to a nozzle 70, and the other end thereof is connected to an electromagnetic valve 60. When the electromagnetic valve 60 transmits a ON signal to the suckback valve 50 to open the photoresist line, the photoresist 80 transmits a signal to the first relay 20 as the nozzle 70 dispenses such that a current is applied to a coil 201 in the first relay 20 to generate a magnetic field. Contacts 202 and 203 are then connected to actuate the start watch 10. At this time, the optical fiber sensor 40 transmits a OFF signal to the second relay 30 when the photoresist 80 is detected, such that a current is applied to a coil 301 in the second relay 30 to generate a magnetic field. Contacts 302 and 303 are then connected to stop the stopwatch 10. The value read from the stopwatch 10 is the delay time between the suckback valve 50 and the electromagnetic valve 60. The function of the suckback valve 50 can be determined as normal or abnormal by the delay time. The fact that the response time of the suckback valve 50 to the control signal of the electromagnetic valve 60 is long, i.e. the delay time is long, may result from the incorrect operation or failure of the suckback valve 50. At the same time, the electromagnetic valve 60 cannot exactly control the dispensing of the photoresist to result in defects such as those set forth above. Therefore, it is determined by the delay time whether the suckback valve 50 is to be replaced or not.

According to the experimental results, the delay time and the planarity are in a substantially linear relationship. The delay time between the suckback valve 50 and the electromagnetic valve 60 can be adjusted by the ON/OFF speed of the suckback valve 50, thereby controlling the planarity in the desired range.

Figure 3:
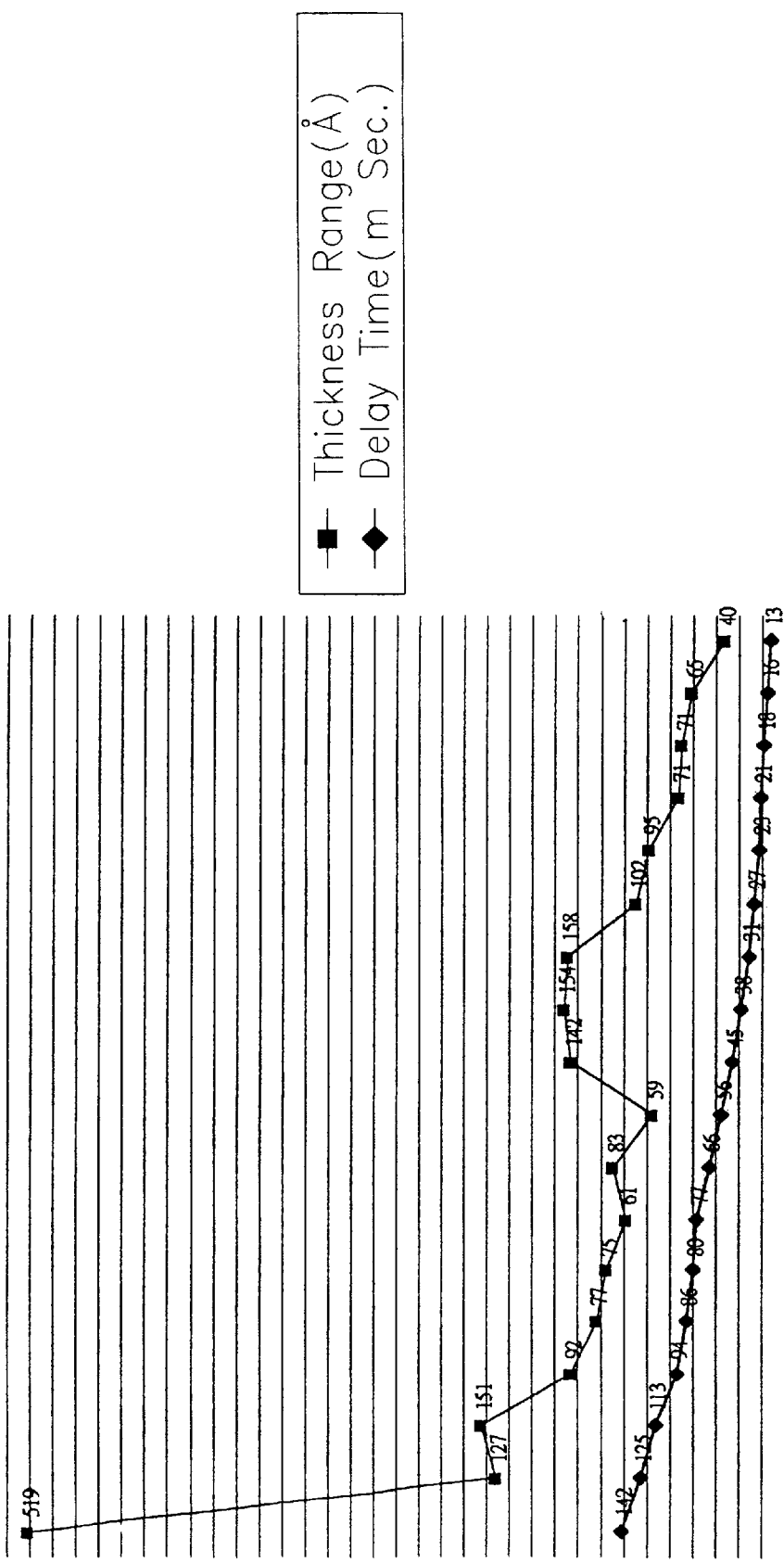

Data shown in FIG. 3 are the result of an experiment to obtain the relationship between the delay time (millisecond) between the suckback valve 50 and the electromagnetic valve 60 and the difference between the maximum and minimum thicknesses of the photoresist, using the photoresist of No. 38A9. It is noted that different experimental results are obtained with different viscosity coefficients. As seen from FIG. 3, the delay time and the planarity are in a substantially linear relationship. The delay time for the suckback valve 50 and the electromagnetic valve 60 can be adjusted by the ON/OFF speed of the suckback valve 50, thereby controlling the planarity in the desired range.

With the apparatus and the method for measuring the valve dispensing time according to the present invention, the delay time between the suckback valve and the electromagnetic valve can be exactly controlled to enhance the planarity of the photoresist coating and to prevent the photoresist coating from having defects.

It will be apparent to those skilled in the art that various modifications and variations can be made to the structure of the present invention without departing from the scope or spirit of the invention. In view of the foregoing, it is intended that the present invention cover modification and variation of this invention provided they fall within the scope of the following claims and their equivalents.

What is claimed is:

1. An apparatus for measuring valve dispensing time, comprising:

an optical fiber sensor arranged in a vicinity of an outlet of a nozzle;

a first relay in which a magnetic field is generated in coils of the first relay by an ON signal from an electromagnetic valve, such that contacts thereof are connected to each other;

a second relay in which a magnetic field is generated in coils of the second relay by an OFF signal from the electromagnetic valve, such that contacts thereof are connected to each other; and a stopwatch including a start terminal connected to the first relay and a stop terminal connected to the second relay.

2. The apparatus for measuring valve dispensing time of claim 1, wherein the optical fiber sensor is used to monitor a time period from starting to dispense the photoresist from the nozzle to stopping dispensing.

3. The apparatus for measuring valve dispensing time of claim 1, wherein the optical fiber sensor is used to detect discontinuous photoresist dispensing.

4. The apparatus for measuring valve dispensing time of claim 1, wherein the optical fiber sensor is used to detect a delay time between a electric signal of the suckback valve and an actual photoresist dispensing.

5. The apparatus for measuring valve dispensing time of claim 1, wherein the valve displayed on the stopwatch is delay time between the suckback valve and the electromagnetic valve.

6. The apparatus for measuring valve dispensing time of claim 1, wherein the read value of the stopwatch is controlled by adjusting the ON/OFF speed of the suckback valve.

7. A method of measuring valve dispensing time, comprising:

providing an optical fiber sensor in a vicinity of an outlet of a nozzle;

providing a first relay;

providing a second relay; and providing a stop watch, wherein when an electromagnetic valve transmits an ON signal to a suckback valve to open a photoresist line, the photoresist transmits a signal to the first relay as the nozzle dispenses such that a current is applied to coil in the first relay to generate a magnetic field, and contacts are then connected to start the stop watch.

8. The method of measuring valve dispensing time of claim 7, wherein the optical fiber sensor is used to monitor a period from starting to dispense the photoresist from the nozzles to stopping dispensing.

9. The method of measuring valve dispensing time of claim 7, wherein the optical fiber sensor is used to detect discontinuous photoresist dispensing.

10. The method of measuring valve dispensing time of claim 7, wherein the optical fiber sensor is used to provide a delay time between an electric signal of the suckback valve and an actual photoresist dispensing.

11. The method of measuring valve dispensing time of claim 7, wherein a valve on the stopwatch is a delay time between the suckback valve and the electromagnetic valve.

12. The method of measuring valve dispensing time of claim 11, wherein a read value of the stopwatch is controlled by adjusting the ON/OFF speed of the suckback valve.

* * * * *